US012652934B2

(12) United States Patent
Hu et al.

(10) Patent No.: US 12,652,934 B2
(45) Date of Patent: Jun. 9, 2026

(54) DISPLAY PANEL AND METHOD FOR FORMING THE SAME

(71) Applicant: Hefei Visionox Technology Co., Ltd., Hefei (CN)

(72) Inventors: Qingyuan Hu, Hefei (CN); Bo Li, Hefei (CN); Suhua Li, Hefei (CN); Jiandu Chen, Hefei (CN)

(73) Assignee: HEFEI VISIONOX TECHNOLOGY CO., LTD., Anhui Hefei (CN)

( * ) Notice: Subject to any disclaimer, the term of this patent is extended or adjusted under 35 U.S.C. 154(b) by 379 days.

(21) Appl. No.: 18/333,845

(22) Filed: Jun. 13, 2023

(65) Prior Publication Data

US 2023/0329069 A1      Oct. 12, 2023

Related U.S. Application Data

(63) Continuation of application No. PCT/CN2021/126676, filed on Oct. 27, 2021.

(30) Foreign Application Priority Data

Jan. 11, 2021      (CN) ......................... 202110034167.X

(51) Int. Cl.
*H10K 59/80*          (2023.01)
*H10K 59/12*          (2023.01)
*H10K 59/122*        (2023.01)
(52) U.S. Cl.
CPC ....... *H10K 59/873* (2023.02); *H10K 59/1201* (2023.02); *H10K 59/122* (2023.02)
(58) Field of Classification Search
CPC .. H10K 50/11; H10K 59/1201; H10K 59/122; H10K 59/124; H10K 59/8723; H10K 59/873
See application file for complete search history.

(56) References Cited

U.S. PATENT DOCUMENTS 11,309,519 B2 *     4/2022    Dong ................. H10K 59/8731
2015/0236080 A1     8/2015    Cho
(Continued)

FOREIGN PATENT DOCUMENTS

CN        110518141 A        8/2019
CN        110265471 A        9/2019
(Continued)

OTHER PUBLICATIONS

Office Action issued on Feb. 8, 2022, in corresponding Chinese Application No. 20110034167.X, 21 pages.
(Continued)

*Primary Examiner* — Shaun M Campbell
(74) *Attorney, Agent, or Firm* — Maier & Maier, PLLC

(57)          ABSTRACT

A display panel and a method for forming the display panel. The display panel includes a substrate, a display function portion, and a spacing assembly. The display function portion includes a pixel circuit layer and a first light-emitting material layer. The spacing assembly includes spacing walls, spacing holes and barrier layers. The spacing walls are spaced apart from one another and arranged in a ring shape around the hole area. A second light-emitting material layer is formed on a side of the spacing walls facing away from the substrate. Each of the spacing holes is positioned between adjacent two of the spacing walls. The barrier layers are formed on the substrate. A third light-emitting material layer is formed on the barrier layers exposed by the spacing holes.

13 Claims, 4 Drawing Sheets

(56)                References Cited

U.S. PATENT DOCUMENTS

| | | | |
|---|---|---|---|
| 2020/0313102 A1 | 10/2020 | Kim et al. | |
| 2021/0028249 A1 * | 1/2021 | Ding | H10D 86/0231 |
| 2022/0069021 A1 * | 3/2022 | Kim | H10K 59/1213 |
| 2022/0123075 A1 * | 4/2022 | Kim | G06F 1/1605 |

FOREIGN PATENT DOCUMENTS

| | | | |
|---|---|---|---|
| CN | 110265583 A | 9/2019 |
| CN | 110416282 A | 11/2019 |
| CN | 110429118 A | 11/2019 |
| CN | 110634928 A | 12/2019 |
| CN | 110767827 A | 2/2020 |
| CN | 110993660 A | 4/2020 |
| CN | 111180496 A | 5/2020 |
| CN | 112802979 A | 5/2021 |

OTHER PUBLICATIONS

Office Action issued on Jul. 14, 2022, in corresponding Chinese Application No. 202110034167.X, 21 pages.
International Search Report issued on Jan. 19, 2022, in corresponding International Application No. PCT/CN2021/126676, 4 pages.
Office Action issued on Oct. 27, 2022, in corresponding Chinese Application No. 202110034167.X, 7 pages.

* cited by examiner

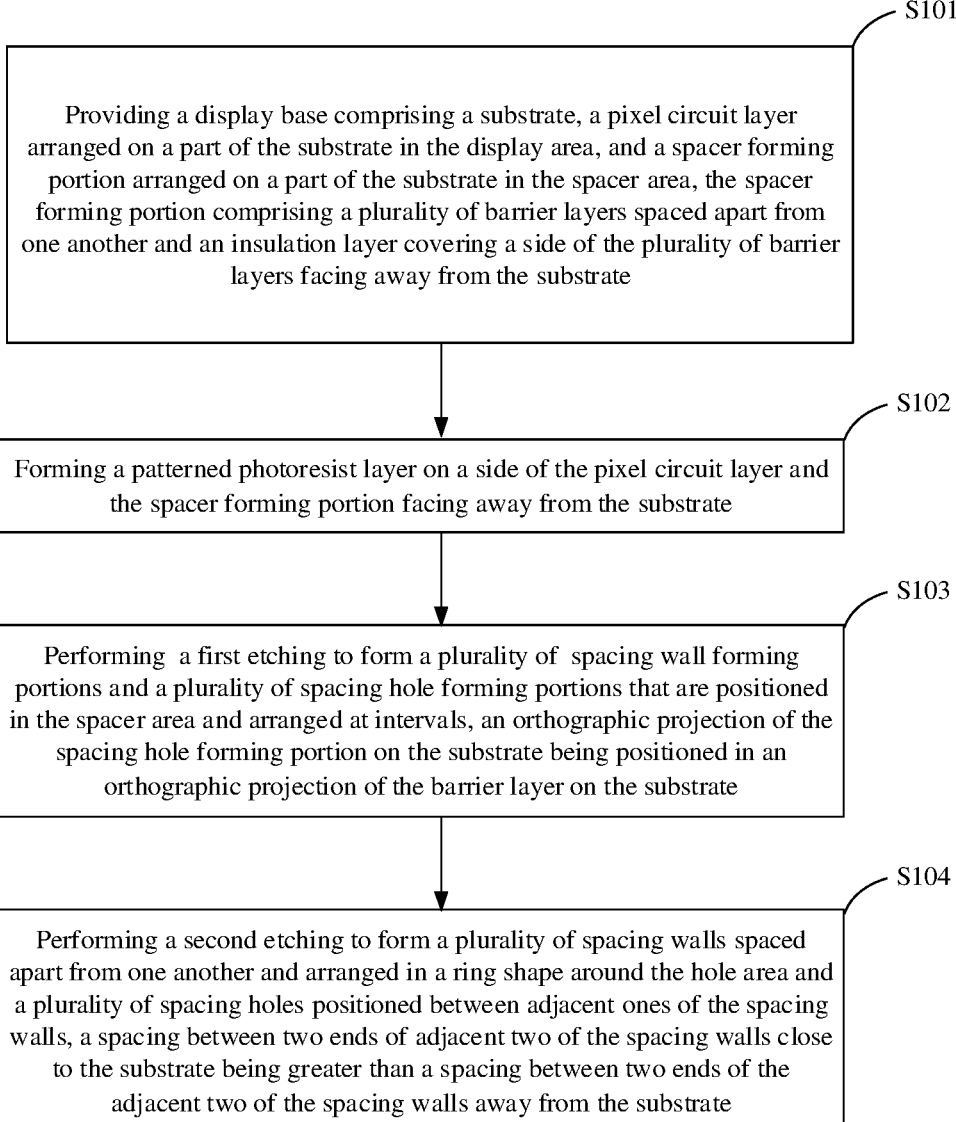

S101

Providing a display base comprising a substrate, a pixel circuit layer arranged on a part of the substrate in the display area, and a spacer forming portion arranged on a part of the substrate in the spacer area, the spacer forming portion comprising a plurality of barrier layers spaced apart from one another and an insulation layer covering a side of the plurality of barrier layers facing away from the substrate

S102

Forming a patterned photoresist layer on a side of the pixel circuit layer and the spacer forming portion facing away from the substrate

S103

Performing a first etching to form a plurality of spacing wall forming portions and a plurality of spacing hole forming portions that are positioned in the spacer area and arranged at intervals, an orthographic projection of the spacing hole forming portion on the substrate being positioned in an orthographic projection of the barrier layer on the substrate

S104

Performing a second etching to form a plurality of spacing walls spaced apart from one another and arranged in a ring shape around the hole area and a plurality of spacing holes positioned between adjacent ones of the spacing walls, a spacing between two ends of adjacent two of the spacing walls close to the substrate being greater than a spacing between two ends of the adjacent two of the spacing walls away from the substrate

Fig. 2

DISPLAY PANEL AND METHOD FOR FORMING THE SAME

CROSS-REFERENCE TO RELATED APPLICATIONS

This application is a continuation of International Application No. PCT/CN2021/126676, filed on Oct. 27, 2021, which claims priority to Chinese Patent Application No. 202110034167.X, filed on Jan. 11, 2021, both of which are hereby incorporated by reference in their entireties.

TECHNICAL FIELD

The present application relates to the technical field of display devices, and particularly relates to a display panel and a method for forming the display panel.

BACKGROUND

In the current display industry, LTPS-AMOLED technology and hole-punch screen technology are popular currently. In the process of manufacturing hole-punch screen, the packaging around the in-screen hole is very important, and terrible packaging will affect the life of the display device. According to the current packaging solution in the industry, metal spacing walls are formed around the hole for separation from a light-emitting device layer, and the spacing wall is formed in a side-etching manner. The removed amount by side-etching is difficult to on-line monitor and bad batches are likely to be produced.

SUMMARY

Embodiments of the present application provide a display panel and a method for forming the display panel. Spacing walls and spacing holes formed in a spacing area in the display panel are easy to form and have a good spacing effect.

In an aspect, an embodiment of the present application provides a display panel. The display panel includes a hole area, a spacer area and a display area. The spacer area is arranged around at least part of the hole area. The spacer area is positioned between the hole area and the display area. The display panel includes a substrate, a display function portion, and a spacing assembly. The display function portion is positioned on a side of the substrate in the display area and includes a pixel circuit layer and a first light-emitting material layer that are stacked. The spacing assembly is positioned on a side of the substrate in the spacing area and includes a plurality of spacing walls, a plurality of spacing holes and a plurality of barrier layers. The spacing walls are spaced apart from one another and arranged in a ring shape around the hole area. A second light-emitting material layer is formed on a side of the spacing walls facing away from the substrate. Each of the spacing holes is positioned between adjacent two of the spacing walls. A spacing between two ends of adjacent two of the spacing walls close to the substrate is greater than a spacing between two ends of the adjacent two of the spacing walls away from the substrate. The barrier layers are formed on the substrate. An orthographic projection of the spacing hole on the substrate is positioned in an orthographic projection of the barrier layer on the substrate. A third light-emitting material layer is formed on the barrier layers exposed by the spacing holes. The second light-emitting material layer and the third light-emitting material layer are discontinuously arranged and spaced apart from each other.

In another aspect, the present application further provides a method for forming a display panel. The display panel includes an hole area, a spacing area and a display area. The spacing area is arranged around at least part of the hole area. The spacing area is positioned between the hole area and the display area. The method includes:

providing a display base comprising a substrate, a pixel circuit layer arranged on a part of the substrate in the display area, and a spacer forming portion arranged on a part of the substrate in the spacer area, the spacer forming portion comprising a plurality of barrier layers spaced apart from one another and an insulation layer covering a side of the plurality of barrier layers facing away from the substrate;

forming a patterned photoresist layer on a side of the pixel circuit layer and the spacer forming portion facing away from the substrate;

performing a first etching to form a plurality of spacing wall forming portions and a plurality of spacing hole forming portions that are positioned in the spacer area and arranged at intervals, an orthographic projection of the spacing hole forming portion on the substrate being positioned in an orthographic projection of the barrier layer on the substrate;

performing a second etching to form a plurality of spacing walls spaced apart from one another and arranged in a ring shape around the hole area and a plurality of spacing holes positioned between adjacent ones of the spacing walls, a spacing between two ends of adjacent two of the spacing walls close to the substrate being greater than a spacing between two ends of the adjacent two of the spacing walls away from the substrate.

The spacing area of the display substrate provided by embodiments of the present application is provided with the spacing walls separated by the spacing holes, and the barrier layers are arranged at the spacing holes, so that the light-emitting material layer is distributed as the first light-emitting material layer on the display function portion, the second light-emitting material layer on the spacing walls and the third light-emitting material layer positioned in the spacing holes, which are discontinuous and spaced apart from one another, so as to prevent water and oxygen entering from the hole area from causing damage to the first light-emitting material layer positioned in the display area. That is, water and oxygen are prevented from entering the first light-emitting material layer from the hole area, so that the first light-emitting material layer is better encapsulated, and thus desired display effect of the display area can be ensured.

BRIEF DESCRIPTION OF THE DRAWINGS

FIG. 2 is a flowchart of a method for forming a display panel according to an embodiment of the present application;

DETAILED DESCRIPTION

For a better understanding of the present application, a display panel and a method of manufacturing the display panel according to embodiments of the present application are described in detail below with reference to FIG. 1 to FIG. 6.

Figure 1:
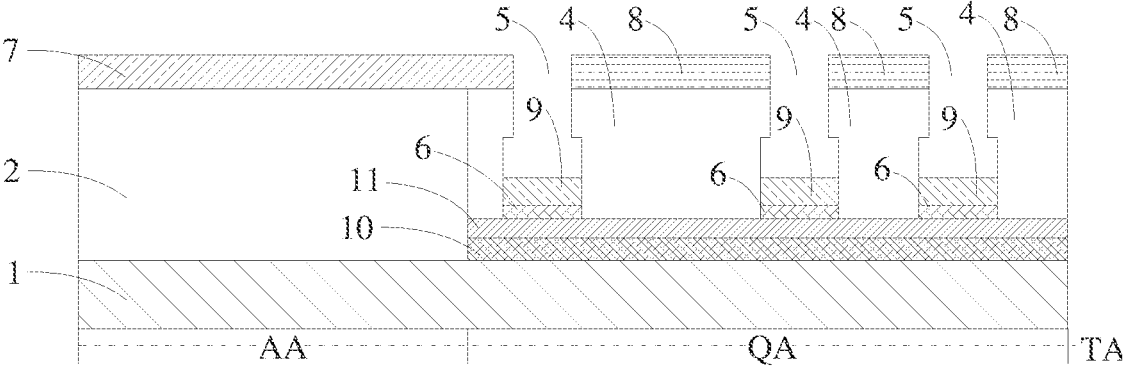
FIG. 1 is a schematic structural diagram of a display panel according to an embodiment of the present application.

With reference to FIG. 1, an embodiment of the present application provides a display panel. The display panel includes a hole area TA, a spacer area QA and a display area AA. The spacer area QA is arranged around at least part of the hole area TA. The spacer area QA is positioned between the hole area TA and the display area AA. The display panel includes a substrate 1, a display function portion and a spacing assembly. The display function portion is arranged on a side of the substrate 1 in the display area AA. The display function portion includes a pixel circuit layer 2 and a first light-emitting material layer 7 that are stacked. The spacing assembly is arranged on a side of the substrate 1 in the spacer area QA. The spacing assembly includes a plurality of spacing walls 4, a plurality of spacing holes 5 and a plurality of barrier layers 6. The spacing walls 4 are spaced apart from one another and are ring-shaped around the hole area TA. A second light-emitting material layer 8 is formed on a side of the spacing walls 4 facing away from the substrate 1. The spacing hole 5 is positioned between adjacent two of the spacing walls 4. A spacing between two ends of the two adjacent spacing walls 4 close to the substrate 1 is greater than a spacing between two ends of the two adjacent spacing walls 4 away from the substrate 1. The barrier layers 6 are formed on the substrate 1. An ortho- graphic projection of the spacing hole 5 on the substrate is positioned in an orthographic projection of the barrier layer 6 on the substrate 1. A third light-emitting material layer 9 is formed on the barrier layers 6 exposed by the spacing holes 5. The first light-emitting material layer 7, the second light-emitting material layer 8 and the third light-emitting material layer 9 are discontinuous and spaced apart from one another.

In the display substrate provided by an embodiment of the present application, the spacing walls 4 separated by the spacing holes 5 are provided in the spacer area QA, and the barrier layers 6 are provided at the spacing holes 5, so that the light-emitting material layer is provided as the first light-emitting material layer 7, the second light-emitting material layer 8 positioned on the spacing walls 4 and the third light-emitting material layer 9 positioned in the spacing holes 5, which are discontinuous and spaced apart from one another, so as to prevent water and oxygen entering from the hole area TA from causing damage to the first light-emitting material layer 7 positioned in the display area AA. That is, water and oxygen are prevented from entering the first light-emitting material layer 7 from the hole area TA, so that the first light-emitting material layer 7 is better encapsu- lated, and thus desired display effect of the display area AA can be ensured.

It can be understood that a light-emitting element layer includes an anode layer, a pixel definition layer 3, a light- emitting material layer and a cathode layer that are sequen- tially arranged upward along a direction perpendicular to the substrate 1. The anode layer includes a plurality of anodes. The pixel definition layer 3 is formed with a plurality of openings. The openings are in one-to-one correspondence with anodes in the anode layer so as to expose the anodes. The light-emitting material layer is formed in the openings, and includes the first light-emitting material layer 7 posi- tioned in the display area AA, the second light-emitting material layer 8 formed on the side of the spacing walls 4 facing away from the substrate 1, and the third light-emitting material layer 9 formed on the side of the barrier layers 6, exposed by the spacing holes 5, facing away from the substrate 1.

The light-emitting material layer may specifically include one or more of an electron injection layer (EIL), an electron transport layer (ETL), a hole blocking layer (HBL), an electron blocking layer (EBL), a hole transport layer (HTL) and a hole injection layer (HIL).

The above-mentioned display panel further includes an encapsulation layer on a side of the light-emitting element layer facing away from the substrate 1, so as to prevent corrosion of the first light-emitting material layer 7, the second light-emitting material layer 8 and the third light- emitting material layer 9 by water and oxygen.

In a possible embodiment, the spacing wall 4 include a first inorganic film layer formed on the substrate 1 and a second inorganic film layer formed on a side of the first inorganic film layer facing away from the substrate 1. A spacing between adjacent ones of the first inorganic film layers of the spacing walls 4 is greater than a spacing between adjacent ones of the second inorganic film layers of the spacing walls 4.

The spacing wall 4 includes the first inorganic film layer and the second inorganic film layer. The first inorganic film layer is formed on the substrate 1, and the second inorganic film layer is formed on the side of the first inorganic film layer facing away from the substrate 1. The spacing between adjacent first inorganic film layers is greater than the spacing between the adjacent second inorganic film layers, so that the distance between the ends of adjacent spacing walls 4 close to the substrate 1 is greater than the distance between the ends of the adjacent spacing walls 4 away from the substrate 1. Therefore, in the later process of simultaneous formation of the second light-emitting material layer 8 and the third light-emitting material layer 9, the second light- emitting material layer 8 entering the spacing holes 5 and formed on the surface of the barrier layer is stopped at the interface between the first inorganic film layer and the second inorganic film layer. Thus, the second light-emitting material layer 8 and the third light-emitting material layer 9 are discontinuously arranged and spaced part from each other, so as to prevent water vapor from entering via the hole area TA, and prevent the first light-emitting material layer 7 formed in the same layer as the second light-emitting material layer 8 and the third light-emitting material layer 9 from being affected.

In a possible embodiment, a material of the first inorganic film layer is silicon oxide and a material of the second inorganic film layer is silicon nitride.

The first inorganic film layer and the second inorganic film layer are formed using different materials, so that a wet etching process can be used in the formation process to remove different amounts of the first inorganic film layer and the second inorganic film layer by etching. Therefore, the spacing between the ends of two adjacent spacing walls 4 close to the substrate 1 is greater than the spacing between the other ends of the two adjacent spacing walls 4 away from the substrate 1. That is, an etching liquid is selected, which removes a greater amount of the first inorganic film layer than the second inorganic film layer by etching within a certain duration so as to form a spacing wall 4 with a gradient. Thus, the formed second light-emitting material layer 8 and third light-emitting material layer 9 are disconnected at the gradient to achieve spacing function. The gradient of the spacing wall 4 is positioned at the interface between the first inorganic film layer and the second inorganic film layer.

The first inorganic film layer and the second inorganic film layer are both inorganic film layers. The bonding force between the inorganic film layers is strong, and at the same time, the inorganic material has good flatness, which is beneficial for realizing planarization and facilitating the later formation of film layers. The material of the first inorganic film layer is selected as silicon oxide, and the material of the second inorganic film layer is selected as silicon nitride. The material is readily available, and at the same time facilitating the selection of the etching liquid. In a possible embodiment, the material of the barrier layer 6 is a metal.

In the above-mentioned display panel, the pixel circuit layer 2 includes an active layer, a gate insulation layer 10, a first metal layer, a dielectric layer 11, a second metal layer, a third inorganic film layer, a third metal layer and a fourth inorganic film layer that are sequentially arranged upward along a direction perpendicular to the substrate 1. The third inorganic film layer positioned in the display area AA is formed in the same layer as the first inorganic film layer positioned in the spacer area QA. The fourth inorganic film layer positioned in the display area AA is formed in the same layer as the second inorganic film layer positioned in the spacer area QA. The barrier layer 6 may be formed from same metal as the material of the same layer of the first metal layer positioned in the display area AA or the material of the same layer of the second metal layer positioned in the display area AA.

In a possible embodiment, as shown in FIG. 1, a dielectric layer 11 and a gate insulation layer 10 are further formed between the barrier layers 6 and the substrate 1. The gate insulation layer 10 and the dielectric layer 11 are sequentially formed on the substrate 1.

Formation of the gate insulation layer 10 and the dielectric layer 11 between the substrate 1 and the barrier layers 6 can provide a flat surface on the upper surface of the substrate 1, facilitate the later formation of film layers. At the same time, the barrier layers 6 can protect the gate insulation layer 10 and the dielectric layer 11, preventing the formation of the spacing holes 5 corresponding to the barrier layers 6 from affecting the performance of the gate insulation layer 10 and the dielectric layer 11.

Figure 3:
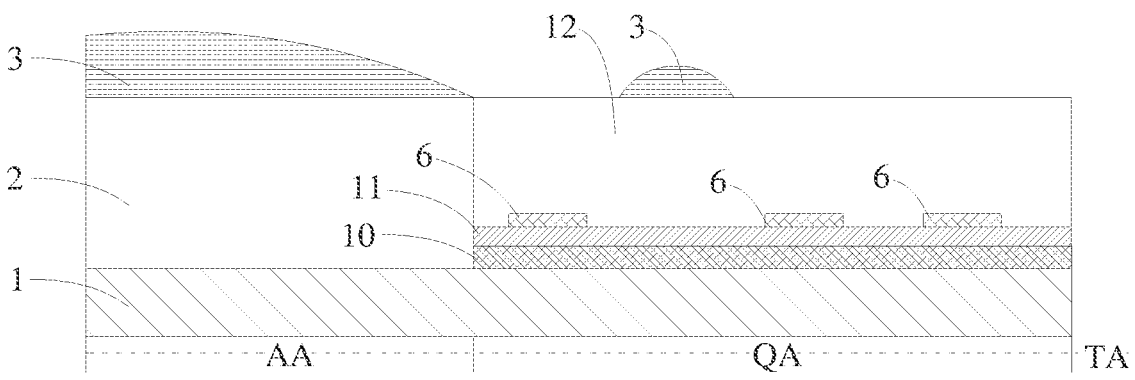
FIG. 3 is a schematic structural diagram of a display panel at a first step in a formation process of the display panel according to an embodiment of the present application.
Figure 4:
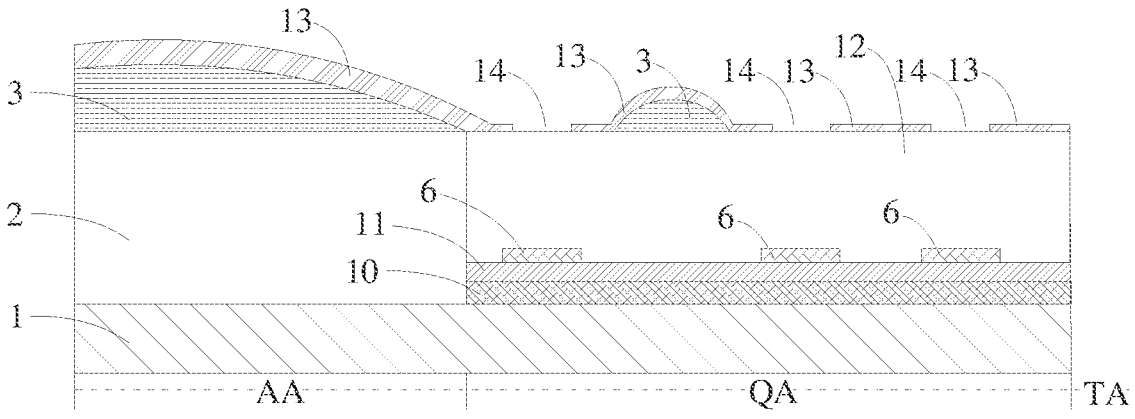
FIG. 4 is a schematic structural diagram of a display panel at a second step in a formation process of the display panel according to an embodiment of the present application.
Figure 5:
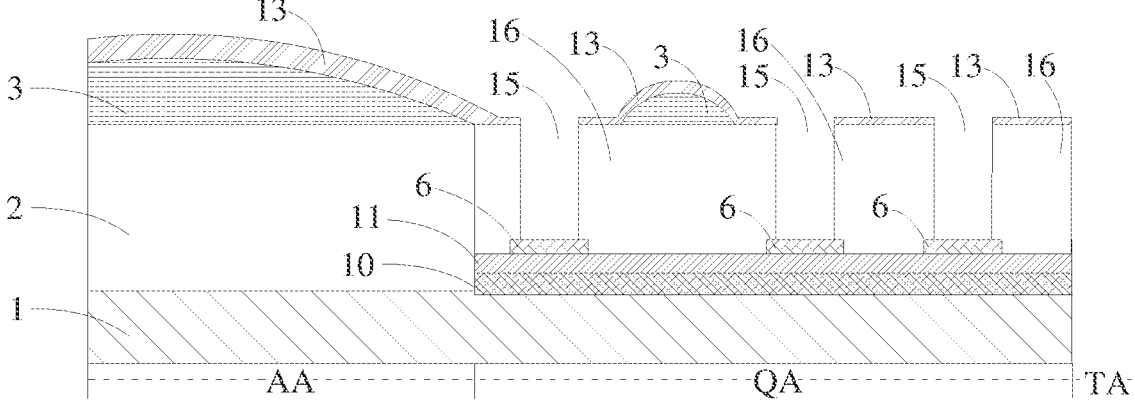
FIG. 5 is a schematic structural diagram of a display panel at a third step in a formation process of the display panel according to an embodiment of the present application.
Figure 6:
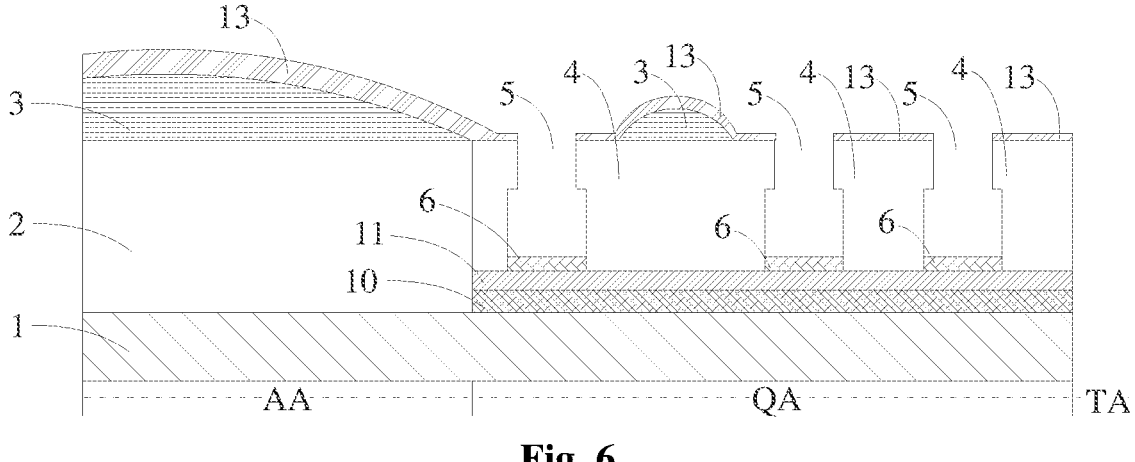
FIG. 6 is a schematic structural diagram of a display panel at a fourth step in a formation process of the display panel according to an embodiment of the present application.

The present application further provides a method for forming a display panel. The display panel includes a hole area TA, a spacer area QA and a display area AA. The spacer area QA is arranged around at least part of the hole area TA. The spacer area QA is positioned between the hole area TA and the display area AA. As shown in FIG. 2, and the formation method includes:

S101: providing a display base comprising a substrate 1, a pixel circuit layer 2 arranged on a part of the substrate 1 in the display area AA, and a spacer forming portion arranged on a part of the substrate 1 in the spacer area QA, the spacer forming portion comprising a plurality of barrier layers 6 spaced apart from one another and an insulation layer 12 covering a side of the plurality of barrier layers 6 facing away from the substrate 1, as shown in FIG. 3;

S102: forming a patterned photoresist layer 13 on a side of the pixel circuit layer and the spacer forming portion facing away from the substrate 1, as shown in FIG. 4;

S103: performing a first etching to form a plurality of spacing wall forming portions 16 and a plurality of spacing hole forming portions 15 that are positioned in the spacer area QA and arranged at intervals, an orthographic projection of the spacing hole forming portion 15 on the substrate being positioned in an orthographic projection of the barrier layer on the substrate, as shown in FIG. 5;

S104: performing a second etching to form a plurality of spacing walls 4 spaced apart from one another and arranged in a ring shape around the hole area and a plurality of spacing holes 5 positioned between adjacent ones of the spacing walls, a spacing between two ends of adjacent two of the spacing walls 4 close to the substrate 1 being greater than a spacing between two ends of the adjacent two of the spacing walls 4 away from the substrate 1, as shown in FIG. 6.

In the above-mentioned method for forming the display panel, a patterned barrier layer 6 is formed in the blocking region QA, so that etching barrier can be realized in the first etching and the second etching, so as to prevent the film layer under the barrier layer 6 from being over-etched to prevent the performance of the film layer under the barrier layer 6 from being affected, thereby helping to improve the yield of the display panel.

In a possible embodiment, the barrier layer is a ring-shaped layer arranged around the hole area, so that the influence of the first etching and the second etching on the film layer under the barrier layer can be effectively blocked in the process of forming the hole area, and at the same time, using the ring-shaped layer can increase the contact area between the first inorganic film layer and the dielectric layer in the spacing wall. The dielectric layer is of a non-metal material, so that its bonding force in contact with the first inorganic film is stronger than the bonding force between metal and the first inorganic film layer, so that the bonding effect between film layers can be improved.

In the above-mentioned method for forming the display panel, the spacing walls 4 and the spacing holes 5 are formed using the insulation layer 12, and the distance between the ends of two adjacent spacing walls 4 close to the substrate 1 is made larger than the distance between the other ends of the two adjacent spacing walls 4 away from the substrate 1 by the two etching processes, Thus, in the later formation of the light-emitting material layer and the cathode layer, both the light-emitting material layer and the cathode layer stop at the spacing hole 5, thereby a spacing function is achieved to prevent corrosion of the light-emitting material layer and the cathode layer by water and oxygen entering from the hole area TA, so that the display effect of the display panel can be improved.

The above-mentioned method for forming the display panel further includes forming an anode layer, a pixel definition layer and a support layer (not shown in the figures) on sides of the pixel circuit layer and the spacer formation portion facing away from the substrate 1. The anode layer includes a plurality of anodes. The formation process of the pixel definition layer includes forming a plurality of openings in one-to-one correspondence with a plurality of anodes of the anode layer to expose the anodes. The support layer is formed on the side of the pixel definition layer facing away from the substrate, and is used for supporting a mask plate in the formation of the light-emitting material layer by evaporation plating, and preventing the mask plate from scratching film layers such as the pixel definition layer.

In a possible embodiment, as shown in FIG. 4, forming the patterned photoresist layer 13 on sides of the pixel circuit layer and the spacer forming portion facing away from the substrate 1 includes: exposing the photoresist layer 13 so that the photoresist layer 13 is formed with a plurality of openings 14 in one-to-one correspondence with the barrier layers 6.

Forming the photoresist layer 13 with the openings 14 facilitates the positioning in the first etching, so as to locating the etching position and prevent improper etching. Patterning can be achieved by exposure using the photoresist layer 13. The formation process is simple. At the same time, the photoresist layer 13 can be removed after the first etching is completed or after the second etching is completed. The removal approach is simple and the later formation of the film layers is not affected.

A width of the opening 14 formed by the above-mentioned formation method is smaller than the width of the barrier layer 6 by 150 angstroms to 200 angstroms. The width of the opening 14 ranges from 1 um to 5 um. The width of the opening 14 can also be adjusted according to practical situations, and the width of the opening 14 is not limited in the present application.

In s possible embodiment, the insulation layer 12 includes a first inorganic film layer on the substrate 1 and a second inorganic film layer on a side of the first inorganic film layer facing away from the substrate 1.

The insulation layer 12 used for forming the spacing wall 4 adopts a double-layer structure, facilitating the formation of the spacing wall 4 having a stepped structure to achieve spacing function. The stepped structure is positioned at the interface between the first inorganic film layer and the second inorganic film layer.

In a possible embodiment, as shown in FIG. 5 and FIG. 6, the first etching includes removing a plurality of parts of the insulation layer 12 corresponding to the openings 14 using a dry etching process to form a plurality of vias penetrating through the insulation layer 12 and corresponding to the barrier layers 6. An orthographic projection of the via on the substrate is positioned in the orthographic projection of the barrier layer on the substrate, so that the spacing wall forming portions 16 and the spacing hole forming portions 15 are formed.

The second etching includes etching a side of the spacing wall forming portion 16 facing the spacing hole forming portion 15 with an etching liquid, and an etching amount of the first inorganic film by the etching liquid is larger than an etching amount of the second inorganic film by the etching liquid.

In the above-mentioned formation method, the first etching process uses a dry etching process to form the vias penetrating through the insulation layer 12 at positions of the insulation layer 12 corresponding to the barrier layers 6. The width of the via is less than the width of the barrier layer 6, so that the barrier layer 6 can effectively block the over-etching of the film layer under the barrier layer 6 in the dry etching process. The second etching process uses a wet etching process, and the first inorganic film layer and the second inorganic film layer in the insulation layer 12 are etched simultaneously using the etching liquid. Since the difference in the materials of the first inorganic film layer and the second inorganic film layer makes the etching rates of the first inorganic film layer and the second inorganic film layer by the etching liquid are different, within a certain duration, the removed amounts of the first inorganic film layer and the second inorganic film layer by the etching liquid are different, so as to form the spacing wall 4 having stepped structure to realize spacing function. The stepped structure is positioned at the interface between the first inorganic film layer and the second inorganic film layer. The barrier layer 6 can also serve to prevent the etching liquid from contacting the gate insulation layer 10 and the dielectric layer 11 under the barrier layer 6, thereby preventing the etching liquid from damaging the properties of the gate insulation layer 10 and the dielectric layer 11.

When the above-mentioned formation process uses one dry etching process and one wet etching process, the etching effect is good, and the etching precision requirement of the dry etching process is low, thereby contributing to saving formation costs.

In a possible embodiment, the material of the first inorganic film layer is silicon oxide, and the material of the second inorganic film layer is silicon nitride. The etching liquid is a buffered oxide etching liquid. The buffered oxide etching liquid includes hydrofluoric acid and water. Content of hydrofluoric acid is 49%; or the buffered oxide etching liquid includes ammonium fluoride and water.

The ratio of etching rates of silicon oxide and silicon nitride by the above-mentioned two etching liquids is 9:1, that is, within a certain duration, the removed amount of silicon oxide by the etching liquid is 9 times the removed amount of silicon nitride by the etching liquid. Therefore, the etching liquid can be used to etch the first inorganic film layer and the second inorganic film layer so as to form the spacing wall 4 having step structure. Thus, some of the film layers in the later formed light-emitting material layer stop at interface so as to realize spacing. The step structure is positioned at the interface between the first inorganic film layer and the second inorganic film layer.

The selection of etching liquid needs to consider the metal type of the barrier layer to prevent the etching liquid from reacting with the barrier layer.

What is claimed is:

1. A method for forming a display panel, the display panel comprising a hole area, a spacer area and a display area, the spacer area being arranged around at least part of the hole area, the spacer area being positioned between the hole area and the display area, wherein the method comprises:

providing a display base comprising a substrate, a pixel circuit layer arranged on a part of the substrate in the display area, and a spacer forming portion arranged on a part of the substrate in the spacer area, the spacer forming portion comprising a plurality of portions of a barrier layer spaced apart from one another and an insulation layer covering a side of the plurality of portions of the barrier layer facing away from the substrate, wherein the insulation layer comprises a first inorganic film layer positioned on the substrate and a second inorganic film layer positioned on a side of the first inorganic film layer facing away from the substrate;

forming a patterned photoresist layer on a side of the pixel circuit layer and the spacer forming portion facing away from the substrate;

performing a first etching to form a plurality of spacing wall forming portions and a plurality of spacing hole forming portions that is positioned in the spacer area and arranged at intervals, an orthographic projection of each spacing hole forming portion of the plurality of spacing hole forming portions on the substrate being positioned in an orthographic projection of a corresponding one of the plurality of portions of the barrier layer on the substrate;

performing a second etching to form a plurality of spacing walls spaced apart from one another and arranged in a ring shape around the hole area and a plurality of spacing holes positioned between adjacent ones of the plurality of spacing walls, a spacing between two ends of adjacent two of the plurality of spacing walls close to the substrate being greater than a spacing between two ends of the adjacent two of the plurality of spacing walls away from the substrate, wherein performing the second etching further comprises:

etching a side of each of the plurality of spacing wall forming portions facing one of the plurality of spacing hole forming portions with an etching liquid, and an etching amount of the first inorganic film layer by the etching liquid is larger than an etching amount of the second inorganic film layer by the etching liquid, wherein forming the patterned photoresist layer on the side of the pixel circuit layer and the spacer forming portion facing away from the substrate further comprises:

exposing the photoresist layer so that the photoresist layer is formed with a plurality of openings in one-to-one correspondence with the plurality of portions of the barrier layer.

2. The method according to claim 1, wherein a width of one of the plurality of openings is smaller than a width of a corresponding one of the plurality of portions of the barrier layer by 150 to 200 angstroms.

3. The method according to claim 2, wherein the width of the one of the plurality of openings ranges from 1 μm to 5 μm.

4. The method according to claim 1, wherein a material of the first inorganic film layer is silicon oxide, and a material of the second inorganic film layer is silicon nitride.

5. The method according to claim 1, wherein the first etching comprises:

removing a plurality of parts of the insulation layer corresponding to the plurality of openings using a dry etching process to form a plurality of vias penetrating through the insulation layer, an orthographic projection of the via on the substrate being positioned in the orthographic projection of the corresponding one of the plurality of portions of the barrier layer on the substrate, so that the plurality of spacing wall forming portions and the plurality of spacing hole forming portions are formed.

6. The method according to claim 1, wherein the etching liquid is a buffered oxide etching liquid comprising hydrofluoric acid and water, and content of the hydrofluoric acid is 49%.

7. The method according to claim 1, wherein the buffered oxide etching liquid comprises ammonium fluoride and water.

8. The method according to claim 1, further comprising:

forming a light-emitting element layer on the side of the pixel circuit layer and the spacer forming portion facing away from the substrate, wherein the light-emitting element layer comprises an anode layer, a pixel definition layer, a light-emitting material layer and a cathode layer, and a process of forming the pixel definition layer comprises:

forming a plurality of openings in one-to-one correspondence with a plurality of anodes of the anode layer to expose the anodes;

forming the light-emitting material layer in the plurality of openings, the light-emitting material layer comprising a first light-emitting material layer positioned in the display area, a second light-emitting material layer formed on a side of the plurality of spacing walls facing away from the substrate, and a third light-emitting material layer formed on a side of the barrier layer, exposed by the plurality of spacing holes, facing away from the substrate.

9. The method according to claim 8, further comprising:

forming a support layer on a side of the pixel definition layer facing away from the substrate.

10. The method according to claim 8, further comprising:

forming an encapsulation layer on a side of the light-emitting element layer facing away from the substrate.

11. The method according to claim 1, further comprising:

removing the photoresist layer after the first etching is completed; or removing the photoresist layer after the second etching is completed.

12. The method according to claim 1, wherein the pixel circuit layer comprises an active layer, a gate insulation layer, a first metal layer, a dielectric layer, a second metal layer, a third inorganic film layer, a third metal layer and a fourth inorganic film layer that are sequentially arranged upward along a direction perpendicular to the substrate, the third inorganic film layer positioned in the display area is formed in the same layer as the first inorganic film layer positioned in the spacer area, the fourth inorganic film layer positioned in the display area is formed in the same layer as the second inorganic film layer positioned in the spacer area, the barrier layer is formed from same metal as a material of the same layer of the first metal layer positioned in the display area or a material of the same layer of the second metal layer positioned in the display area.

13. The method according to claim 1, wherein a ratio of etching rates of the first inorganic film layer and the second inorganic film layer by the etching liquid is 9:1.

* * * * *